United States Patent
Yang et al.

(10) Patent No.: US 8,942,038 B2
(45) Date of Patent: Jan. 27, 2015

(54) HIGH ENDURANCE NONVOLATILE MEMORY

(71) Applicant: SanDisk Technologies Inc., Plano, TX (US)

(72) Inventors: Nian Niles Yang, Mountain View, CA (US); Abhijeet Manohar, Bangalore (IN)

(73) Assignee: SanDisk Technologies, Inc., Plano, TX (US)

( * ) Notice: Subject to any disclaimer, the term of this patent is extended or adjusted under 35 U.S.C. 154(b) by 129 days.

(21) Appl. No.: 13/855,579

(22) Filed: Apr. 2, 2013

(65) Prior Publication Data

US 2014/0293699 A1    Oct. 2, 2014

(51) Int. Cl.
*G11C 11/34* (2006.01)
*G11C 16/04* (2006.01)
*G11C 16/10* (2006.01)

(52) U.S. Cl.
CPC ....................................... *G11C 16/10* (2013.01)
USPC ............ 365/185.03; 365/185.17; 365/185.18; 365/185.19; 365/185.29

(58) Field of Classification Search
CPC ........... G11C 11/5621; G11C 11/5628; G11C 11/5635; G11C 11/5671; G11C 11/5642; G11C 16/12; G11C 16/14; G11C 13/0004; G11C 16/08; G11C 16/10; G11C 16/26; G11C 16/16; G11C 16/349
USPC ............. 365/185.03, 185.17, 185.18, 185.09, 365/185.19, 185.29
See application file for complete search history.

(56) References Cited

U.S. PATENT DOCUMENTS

| | | | |
|---|---|---|---|
| 5,570,315 A | 10/1996 | Tanaka et al. | |
| 5,768,192 A | 6/1998 | Eitan | |
| 5,774,397 A | 6/1998 | Endoh et al. | |
| 5,887,145 A | 3/1999 | Harari et al. | |
| 6,011,725 A | 1/2000 | Eitan | |
| 6,046,935 A | 4/2000 | Takeuchi et al. | |
| 7,951,669 B2 | 5/2011 | Harari et al. | |
| 2008/0084755 A1* | 4/2008 | Mokhlesi | 365/185.21 |
| 2008/0285341 A1* | 11/2008 | Moschiano et al. | 365/185.02 |
| 2010/0091578 A1 | 4/2010 | Kim et al. | |
| 2011/0044113 A1 | 2/2011 | Kim et al. | |
| 2012/0039125 A1* | 2/2012 | Cernea | 365/185.03 |
| 2012/0220088 A1 | 8/2012 | Alsmeier | |
| 2012/0233523 A1 | 9/2012 | Krishnamoorthy | |
| 2012/0254515 A1 | 10/2012 | Melik-Martirosian et al. | |
| 2012/0284587 A1 | 11/2012 | Yu et al. | |
| 2013/0279248 A1* | 10/2013 | Shepard et al. | 365/185.03 |
| 2014/0281766 A1* | 9/2014 | Yang et al. | 714/721 |

OTHER PUBLICATIONS

Eitan et al., "NROM: A Novel Localized Trapping, 2-Bit Nonvolatile Memory Cell," IEEE Electron Device Letters, vol. 21, No. 11, Nov. 2000, pp. 543-545.
Technical Search Report, Jan. 14, 2013, 7 pages.

* cited by examiner

*Primary Examiner* — Hien Nguyen
(74) *Attorney, Agent, or Firm* — Davis Wright Tremaine LLP

(57) ABSTRACT

A nonvolatile memory recycles previously written blocks by reassigning binary logic states and further programming memory cells with modified parameters. Cells are written twice between erase operations, thus reducing wear, and providing higher endurance. Flags indicate whether blocks are recycled, and what parameters to use in programming and reading the blocks.

21 Claims, 6 Drawing Sheets

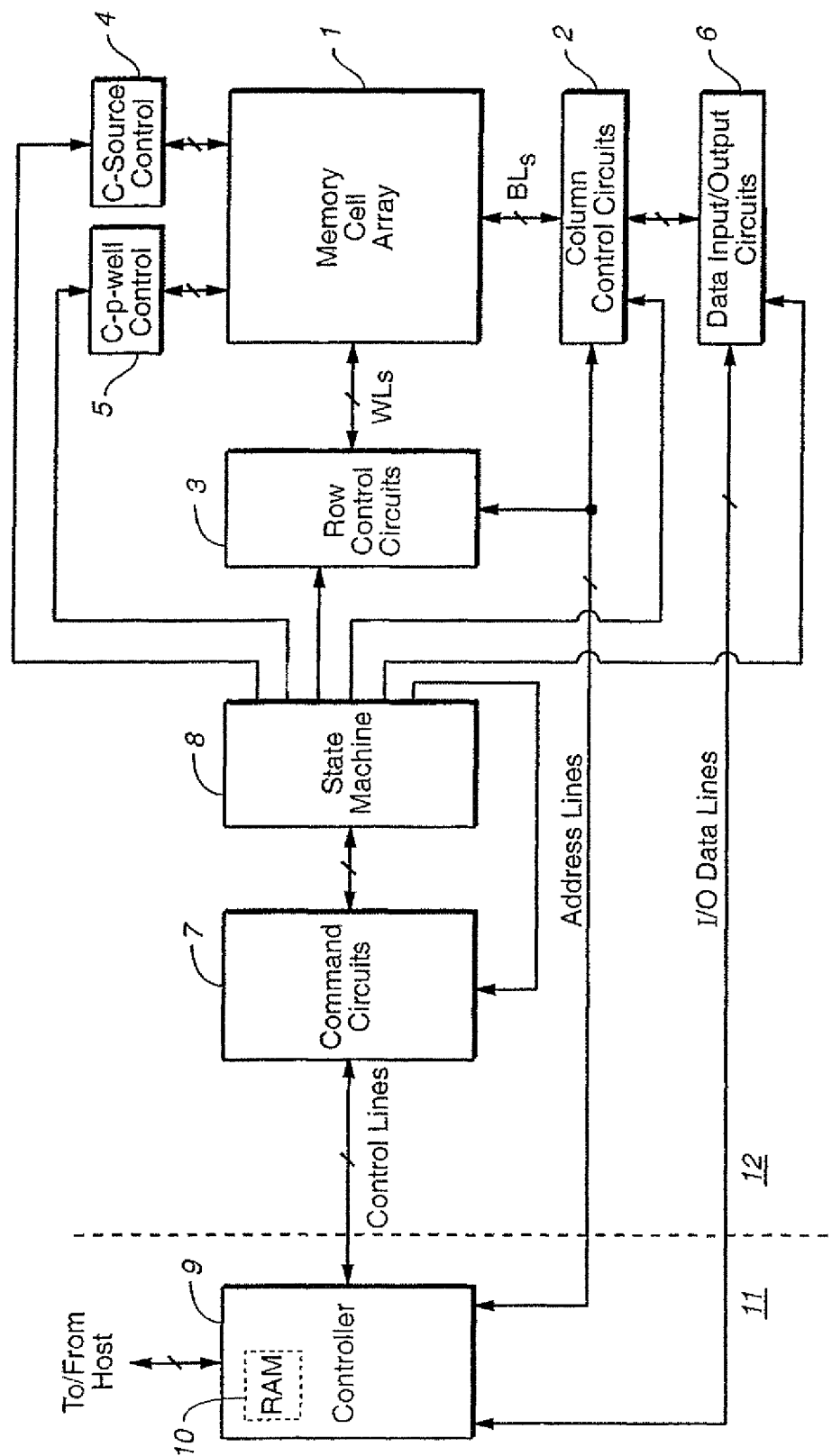
FIG._1
*(Prior Art)*

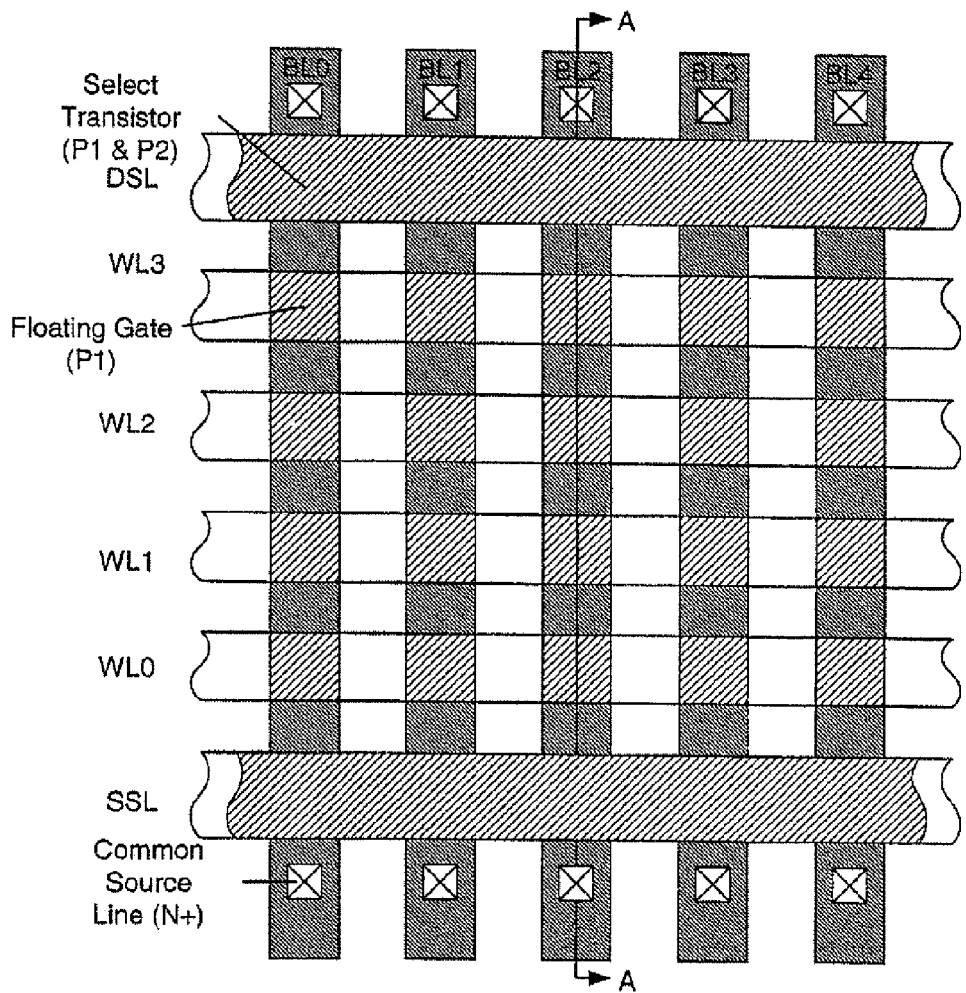
FIG._2A (PRIOR ART)
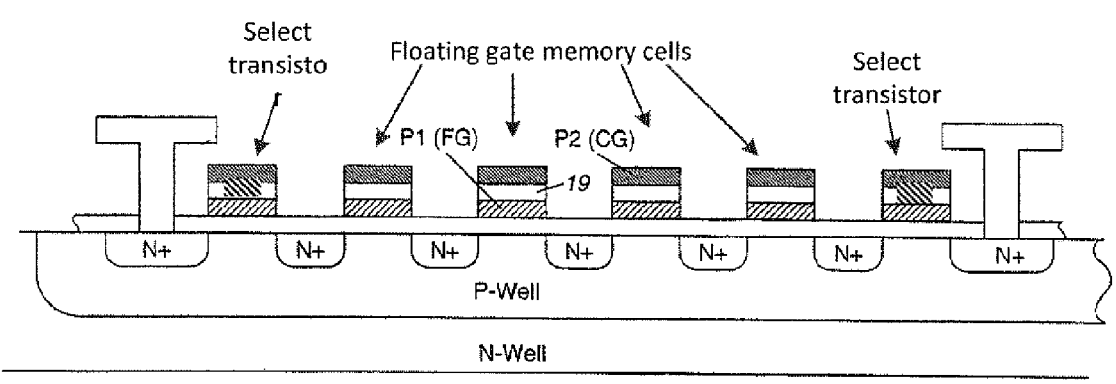
FIG._2B (PRIOR ART)
(Section A-A)

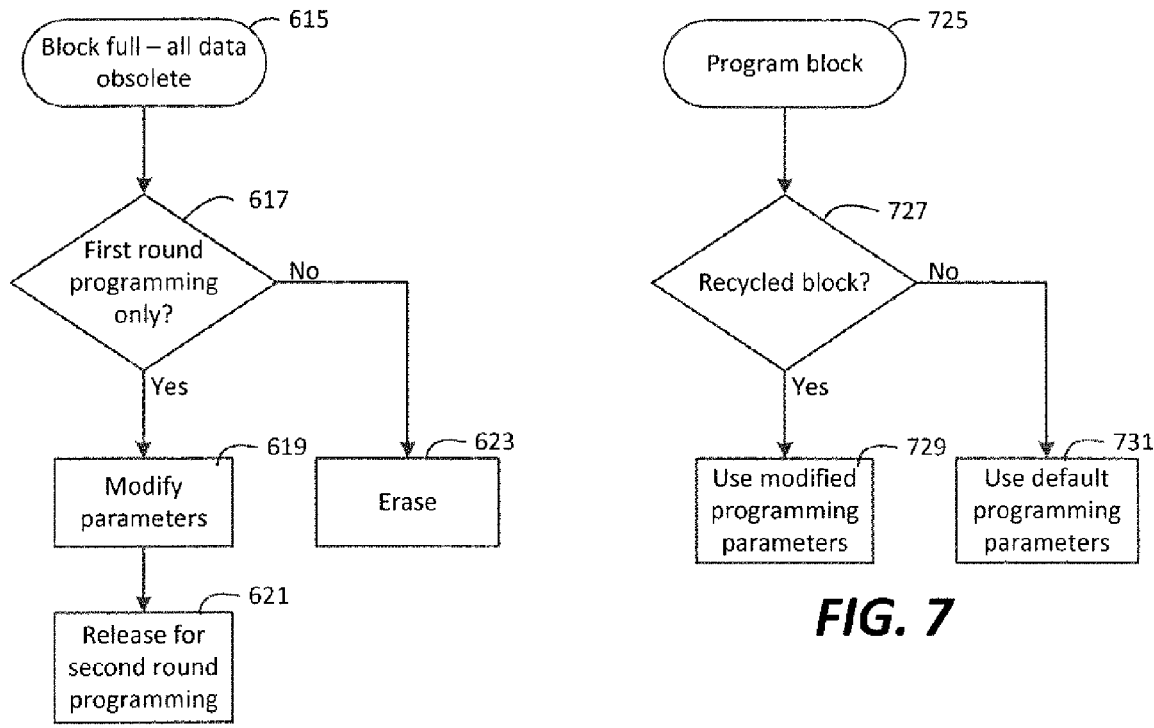
FIG. 6
FIG. 7
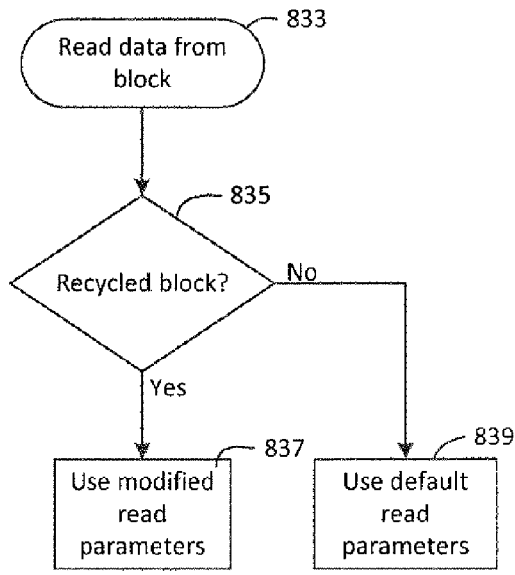
FIG. 8

HIGH ENDURANCE NONVOLATILE MEMORY

BACKGROUND OF THE INVENTION

This invention relates generally to nonvolatile semiconductor memories, their structure and use, and specifically to methods of operating such memories to obtain high endurance.

There are many commercially successful nonvolatile memory products being used today, particularly in the form of small form factor cards, which use an array of flash EEPROM cells. An example of a flash memory system is shown in FIG. 1, in which a memory cell array 1 is formed on a memory chip 12, along with various peripheral circuits such as column control circuits 2, row control circuits 3, data input/output circuits 6, etc.

One popular flash EEPROM architecture utilizes a NAND array, wherein a large number of strings of memory cells are connected through one or more select transistors between individual bit lines and a reference potential. A portion of such an array is shown in plan view in FIG. 2A. BL0-BL4 represent diffused bit line connections to global vertical metal bit lines (not shown). Although four floating gate memory cells are shown in each string, the individual strings typically include 16, 32 or more memory cell charge storage elements, such as floating gates, in a column. Control gate (word) lines labeled WL0-WL3 and string selection lines DSL and SSL extend across multiple strings over rows of floating gates. Control gate lines and string select lines are formed of polysilicon (polysilicon layer 2, or "poly 2," labeled P2 in FIG. 2B, a cross-section along line A-A of FIG. 2A). Floating gates are also formed of polysilicon (polysilicon layer 1, or "poly 1," labeled P1). The control gate lines are typically formed over the floating gates as a self-aligned stack, and are capacitively coupled with each other through an intermediate dielectric layer 19 (also referred to as "inter-poly dielectric" or "IPD") as shown in FIG. 2B. This capacitive coupling between the floating gate and the control gate allows the voltage of the floating gate to be raised by increasing the voltage on the control gate coupled thereto. An individual cell within a column is read and verified during programming by causing the remaining cells in the string to be turned on hard by placing a relatively high voltage on their respective word lines and by placing a relatively lower voltage on the one selected word line so that the current flowing through each string is primarily dependent only upon the level of charge stored in the addressed cell below the selected word line. That current typically is sensed for a large number of strings in parallel, thereby to read charge level states along a row of floating gates in parallel. Examples of NAND memory cell array architectures and their operation are found in U.S. Pat. Nos. 5,570,315, 5,774,397, 6,046,935, and 7,951,669.

Nonvolatile memory devices are also manufactured from memory cells with a dielectric layer for storing charge. Instead of the conductive floating gate elements described earlier, a dielectric layer is used. Such memory devices utilizing dielectric storage element have been described by Eitan et al., "NROM: A Novel Localized Trapping, 2-Bit Nonvolatile Memory Cell," IEEE Electron Device Letters, vol. 21, no. 11, November 2000, pp. 543-545. An ONO dielectric layer extends across the channel between source and drain diffusions. The charge for one data bit is localized in the dielectric layer adjacent to the drain, and the charge for the other data bit is localized in the dielectric layer adjacent to the source. For example, U.S. Pat. Nos. 5,768,192 and 6,011,725 disclose a nonvolatile memory cell having a trapping dielectric sandwiched between two silicon dioxide layers. Multi-state data storage is implemented by separately reading the binary states of the spatially separated charge storage regions within the dielectric.

In addition to NAND flash memory, other forms of flash memory, such as NOR flash memory also use electrical charge stored on a charge storage element such as a floating gate. Other memory systems use other physical phenomena to store data. For example Ferroelectric RAM (FeRAM or FRAM) uses a ferroelectric layer to record data bits by applying an electric field that orients the atoms in a particular area with an orientation that indicates whether a "1" or a "0" is stored. Magnetoresistive RAM (MRAM) uses magnetic storage elements to store data bits. Phase-Change memory (PCME, or PRAM) such as Ovonic Unified Memory (OUM) uses phase changes in certain materials to record data bits. ReRAM uses changes in resistance of resistive elements to record data bits. Various other nonvolatile memories are also in use or proposed for use in nonvolatile memory systems.

SUMMARY OF THE INVENTION

According to embodiments of the present invention, a memory that stores a single bit of data per cell using binary logic states may reuse portions of the memory array that are already full of obsolete data without performing an erase operation. A first round of programming may be performed in a conventional manner. When a portion of the memory is determined to be full of obsolete data from first round programming, it is recycled by modifying the assignment of binary logic states to readable physical characteristics (e.g. threshold voltage) and further programming new data to the cells in a second round of programming. Only after data programmed in the second round is all obsolete is the portion of the memory array erased.

An example of a method of operating a Single Level Cell (SLC) flash memory includes: assigning binary logical states to flash memory cell threshold voltage ranges in a block according to a first assignment scheme; programming memory cells of the block according to the first assignment scheme; subsequently, in response to determining that data programmed in the memory cells of the block is obsolete, assigning binary logical states to flash memory cell threshold voltage ranges in the block according to a second assignment scheme that is different to the first assignment scheme; and further programming the memory cells of the block according to the second assignment scheme without erasing the memory cells of the block between the programming and the further programming.

The first assignment scheme may assign a first binary logical state to an erased threshold voltage range and may assign a second binary logical state to a programmed threshold voltage range. The second assignment scheme may assign the first binary logical state to the erased threshold voltage range and the programmed threshold voltage range, and may assign the second binary logical state to a further programmed threshold voltage range that is higher than the programmed threshold voltage range. The memory cells of the block may be read using a first discrimination voltage when the memory cells are programmed and are not further programmed, and may be read using a second discrimination voltage that is higher than the first discrimination voltage when the memory cells are further programmed. Subsequently, in response to determining that further programmed data is obsolete, an erase operation may be performed.

An example of a method of operating a Single Level Cell (SLC) flash memory array, includes: programming a plurality of memory cells to either a first threshold voltage range representing a first binary logic state or a second threshold voltage range representing a second binary logic state according to a first assignment scheme; and subsequently, in a further programming operation that is performed without an intervening erase operation between the programming and the further programming, further programming individual memory cells of the plurality of memory cells to a third threshold voltage range representing the second binary logic state according to a second assignment scheme.

The first and second threshold voltage ranges may represent the first binary logic state in the second assignment scheme. The first and second threshold voltage ranges may be non-overlapping and memory cells programmed to the first and second threshold voltage ranges that are not further programmed to the third threshold voltage range may have distributions that are allowed to be overlapping after the further programming. The subsequent further programming may be performed in response to identifying data from the first programming stored in the plurality of cells as obsolete. The first threshold voltage range may be a negative threshold voltage range corresponding to an erased condition. The plurality of memory cells may be read using a first discrimination voltage after programming and prior to further programming, and may be read using a second discrimination voltage after the further programming. In response to determining that further programmed data is obsolete, an erase operation may be performed to return the plurality of memory cells to the first threshold voltage range.

An example of a non-volatile memory system includes: an array of nonvolatile memory cells configured to store one bit per memory cell; and programming circuits that are configured to program memory cells, in a first programming operation, to either a first threshold voltage range representing a first binary logic state or a second threshold voltage range representing a second binary logic state according to a first assignment scheme, and subsequently, in a second programming operation performed without an intervening erase operation between the first and second programming operations, to program some of the programmed memory cells to a third threshold voltage range that represents the second binary logic state according to a second assignment scheme, the first and second threshold voltage ranges representing the first binary logic state in the second assignment scheme.

Reading circuits may be configured to read memory cells programmed by only the first programming operation using a first discrimination voltage, and to read memory cells programmed by the second programming operation using a second discrimination voltage. Erase circuits may be configured to erase memory cells after data programmed in the second program operation is obsolete. Status circuits may indicate the status of a plurality of memory cells as either: (a) erased, (b) programmed by the first programming operation only, or (c) programmed by the second program operation. The status circuits may be located on a memory controller integrated circuit chip that is separate from a memory integrated circuit chip where the array of nonvolatile memory cells is located. The array of non-volatile memory cells may be a 2-dimensional NAND or NOR flash memory array. The array of non-volatile memory cells may be a 3-dimensional memory array that has stacks of memory cells extending in a direction perpendicular to a surface of a substrate. The array of non-volatile memory cells may use electrical charge, either negative charge from electrons or positive charge from holes, as an indicator of a programmed state. The array of non-volatile memory cells may use magnetization as an indicator of a programmed state.

Additional aspects, advantages and features of the present invention are included in the following description of examples thereof, which description should be taken in conjunction with the accompanying drawings. All patents, patent applications, articles, technical papers and other publications referenced herein are hereby incorporated herein in their entirety by this reference.

BRIEF DESCRIPTION OF THE DRAWINGS

FIG. 1 is a block diagram of a prior art memory system.
FIG. 2A is a plan view of a prior art NAND array.
FIG. 2B is a cross-sectional view of the prior art NAND array of FIG. 2A taken along the line A-A.
FIG. 6 illustrates management of blocks full of obsolete data.
FIG. 7 illustrates programming of blocks.
FIG. 8 illustrates reading of data from blocks.

DETAILED DESCRIPTION OF EXEMPLARY EMBODIMENTS

Memory System

Figure 3:
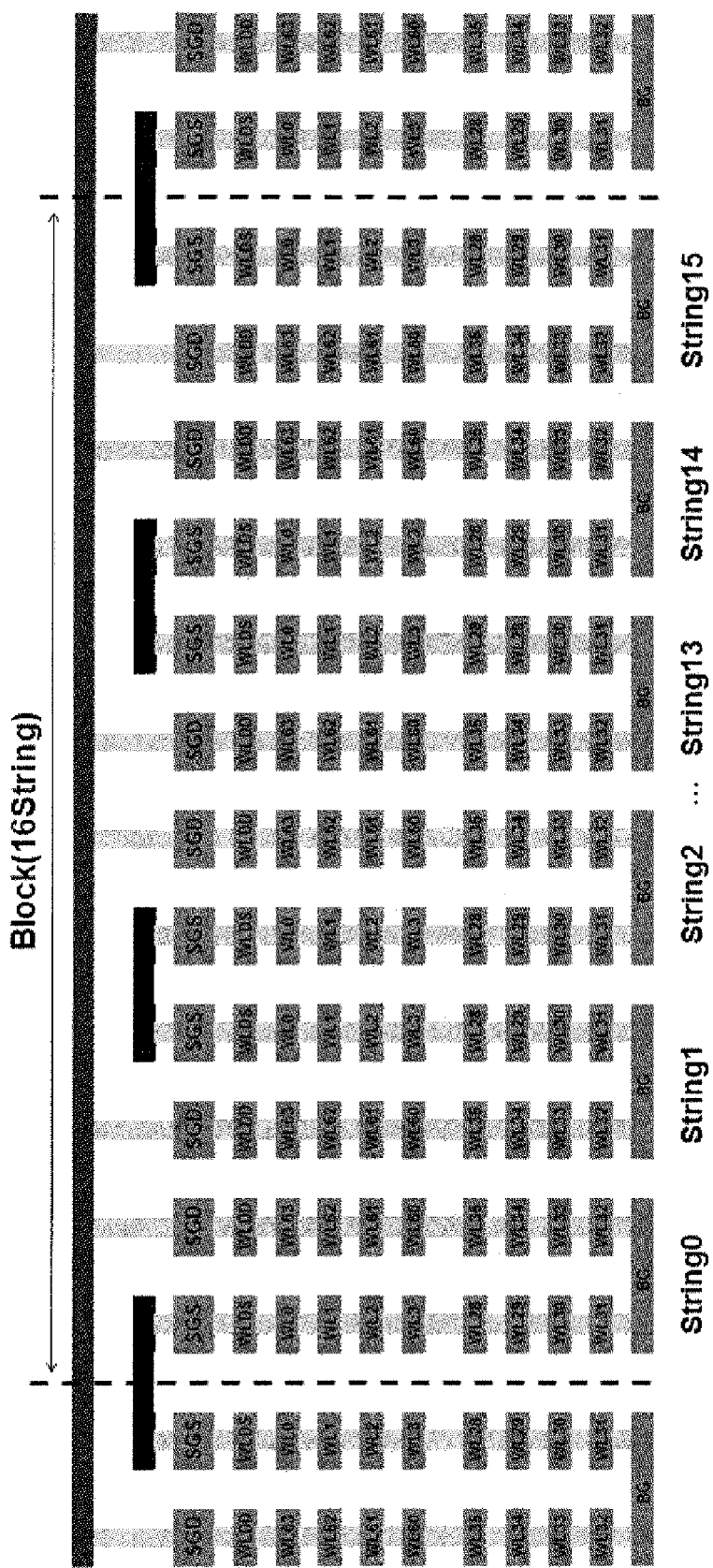
FIG. 3 shows a 3-dimensional memory array.

An example of a prior art memory system, which may be modified to include various aspects of the present invention, is illustrated by the block diagram of FIG. 1. A memory cell array 1 including a plurality of memory cells M arranged in a matrix is controlled by a column control circuit 2, a row control circuit 3, a c-source control circuit 4 and a c-p-well control circuit 5. The memory cell array 1 is, in this example, of the NAND type similar to that described above in the Background and in references incorporated therein by reference. A control circuit 2 is connected to bit lines (BL) of the memory cell array 1 for reading data stored in the memory cells (M), for determining a state of the memory cells (M) during a program operation, and for controlling potential levels of the bit lines (BL) to promote the programming or to inhibit the programming. The row control circuit 3 is connected to word lines (WL) to select one of the word lines (WL), to apply read voltages, to apply program voltages combined with the bit line potential levels controlled by the column control circuit 2, and to apply an erase voltage coupled with a voltage of a p-type region on which the memory cells (M) are formed. The c-source control circuit 4 controls a common source line (labeled as "c-source" in FIG. 1) connected to the memory cells (M). The c-p-well control circuit 5 controls the c-p-well voltage.

The data stored in the memory cells (M) are read out by the column control circuit 2 and are output to external I/O lines via an I/O line and a data input/output buffer 6. Program data to be stored in the memory cells are input to the data input/output buffer 6 via the external I/O lines, and transferred to the column control circuit 2. The external I/O lines are connected to a controller 9. The controller 9 includes various types of registers and other memory including a volatile random-access-memory (RAM) 10.

The memory system of FIG. 1 may be embedded as part of the host system, or may be included in a memory card, USB drive, or similar unit that is removably insertable into a mating socket of a host system. Such a card may include the entire memory system, or the controller and memory array, with associated peripheral circuits, may be provided in separate cards. Several card implementations are described, for example, in U.S. Pat. No. 5,887,145. The memory system of FIG. 1 may also be used in a Solid State Drive (SSD) or similar unit that provides mass data storage in a tablet, laptop computer, or similar device.

FIGS. 2A and 2B show an example of a planar NAND flash memory, from a top-down perspective, and in cross section respectively. FIG. 3 shows an alternative memory array in which U-shaped NAND strings extend vertically, in a direction that is perpendicular to the surface of a substrate. Charge may be stored in charge trapping layers where word lines and vertical bit lines intersect in such structures. Examples of 3-dimensional memory arrays are described in U.S. Patent Publication Number 2012/0220088.

One feature of some types of memory, such as flash memory, is that memory cells must generally be programmed in one direction. For example, in flash memory, charge is generally only added to charge storage elements in order to program memory cells. It is generally not possible to selectively remove charge from charge storage elements of memory cells in order to program them. Instead, cells are configured in blocks (or "erase blocks") which are erased together when the block is full of obsolete data.

Over the life of a memory system, individual blocks may be repeatedly programmed and erased. However, such repeated operation causes wear on the memory cells and eventually causes failure of significant numbers of cells, and failure of the block. The number of write-erase cycles may be counted for each block and used to apply wear-leveling algorithms to try to even out wear and avoid blocks prematurely failing from overuse. In general, blocks fail in a predictable manner as a function of the number of write-erase cycles. Endurance is limited by wearing out of blocks as a result of repeated write-erase cycles. Aspects of the present invention provide ways to allow more data to be programmed before blocks wear out and thus improve the endurance of the memory system.

Figure 4A:
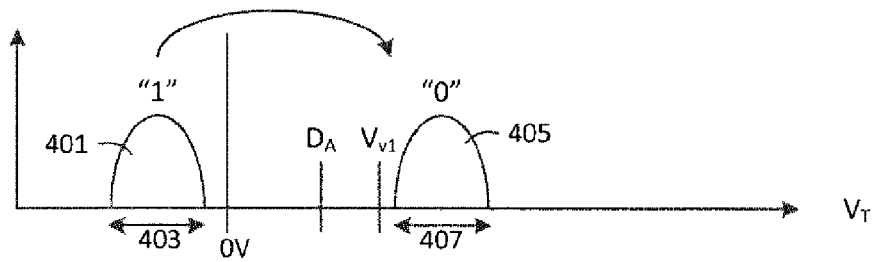
FIG. 4A shows a first stage programming operation.

FIG. 4A shows how cells in a two-state (binary) memory are programmed. A charge-storage memory is used in this example but it will be understood that aspects of the present invention can be applied to any suitable memory. Initially, all memory cells are in an erased condition as shown by the distribution 401. Distribution 401 corresponds to threshold voltage range 403, which is negative ($V_T<0V$) and is generally achieved by performing an erase operation, including erase verification. Subsequently, the memory cells are programmed as shown so that some of the cells have charge added to their charge storage elements, thus increasing their threshold voltages to distribution 405 which has a threshold voltage range 407 that is separated from the erased threshold voltage range 403. In this example, the erased state is designated as binary logic state "1" while the programmed state is designated as binary logic state "0." It will be understood that these designations are arbitrary. Programming memory cells includes performing program verification to confirm that cells have reached their programmed states. Typically, a series of program and verify steps are performed until a verify step indicates that all, or some sufficient number of cells, have reached their desired threshold voltage ranges. In FIG. 4A the program verify voltage is $V_{v1}$ and the threshold voltage range 407 for logic "0" is higher than this voltage. Subsequently, memory cells are read by using a discrimination voltage $D_A$ that is between distribution 401 for binary logic state "1" and distribution 405 for binary logic state "0." Cells with a threshold voltage below $D_A$ are read as storing a "1" bit, while cells with a threshold voltage above $D_A$ are read as storing a "0" bit.

In many prior art binary memory systems, cells that are programmed must be erased (memory cells returned to the "1" state) prior to storing any other data. For example, a flash memory may include a number of erase blocks, where an erase block is the unit of erase. When an individual erase block is determined to be full of obsolete data, it may be erased and thus made available for further storage of data. Blocks that contain a mix of valid and obsolete data may be garbage collected so that valid data is consolidated to a block, or smaller number of blocks, thus freeing up some blocks to be erased.

According to an aspect of the present invention, memory cells that were previously programmed with data that has become obsolete are not erased prior to being reprogrammed. Instead, they are reused, or recycled, prior to erase so that the number of erase operations may be reduced.

Figure 4B:
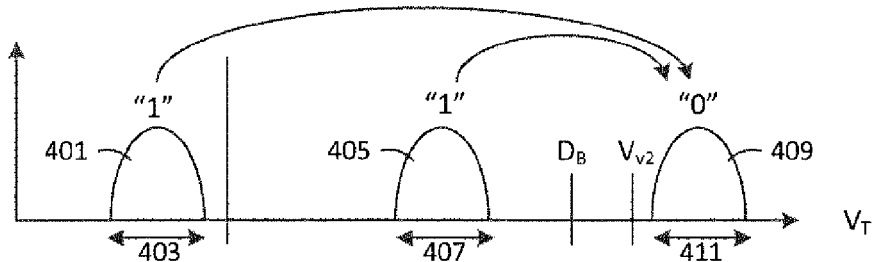
FIG. 4B shows a second stage programming operation.

FIG. 4B shows how memory cells, that were programmed as shown in FIG. 4A in a first round of programming, may be further programmed in a second round of programming to store more data, without an intervening erase operation between the first round of programming and the second round of programming. In particular, further programmed distribution 409 is shown in FIG. 4B. Distribution 409 has a higher threshold voltage range 411 than threshold voltage ranges 403 and 407, and is verified using a verification voltage $V_{v2}$ that is higher. Distribution 409 represents binary logic "0" in the new assignment scheme, with the previously programmed threshold voltage range 407 reassigned from binary logic 0 in the old assignment scheme to binary logic "1" in the new assignment scheme. Thus, both erased and programmed memory cells are considered to store a "1" bit, with only further programmed cells considered to store a binary logic "0" according to the new assignment scheme. Cells may be read by using a discrimination voltage $D_B$ that lies between the programmed distribution 405 and the further programmed distribution 409.

It can be seen that a block may be programmed twice between erase operations using the scheme described above. Instead of erasing the block when the data programmed in the first round becomes obsolete, the block is recycled and programmed further in a second programming round. Thus, the number of erase operations may be half the number used in a prior art memory system under the same conditions. One measure of memory endurance is the Total Bytes Written (TBW) which indicates how much total data is stored before the memory fails (i.e. the sum of data written and erased over the life of the product). It has been found that for certain memory designs, an erase operation has a greater impact than a write operation so that most of the damage of a write-erase cycle is from the erase, not from the write. Using a write-write-erase cycle instead of a write-erase cycle stores twice as much data per full cycle and may cause little more wear per cycle. Thus, the TBW may be almost doubled as compared with a conventional SLC memory.

Any suitable programming scheme may be used to perform the further programming shown. The same program and verify steps may be applied to all cells. Alternatively, some different schemes may be used for cells that are in the two different distributions shown so that programming can be performed reasonably rapidly while avoiding overprogramming. For example, cells in the erased state may be subject to different programming conditions to provide faster programming because of the greater programming required for these cells. Cells in the erased state that are to be programmed may all be brought to the programmed state before further programming in parallel with cells that were in the programmed state. It will be understood that the wider range of threshold voltages of cells prior to further programming of FIG. 4B as compared with prior to programming of FIG. 4A may make such different programming desirable for further programming, but that it is generally not essential.

While the further programming of FIG. 4B bears some resemblance to programming of upper page data in a Multi-Level Cell (MLC) memory, there are several important differences. Firstly, the further programming of FIG. 4B destroys the data programmed in the first round so that the first round data cannot be read from the memory cells. All cells that are further programmed have threshold voltages in the further programmed threshold voltage range 411 and their original programmed states cannot be determined (i.e. whether they were programmed from the erased distribution 401 or the programmed distribution 405 they are read the same). Thus, rather than storing more than one bit at a time in a memory cell (as in MLC) the method shown stores only one bit per cell at any given time.

Figure 5:
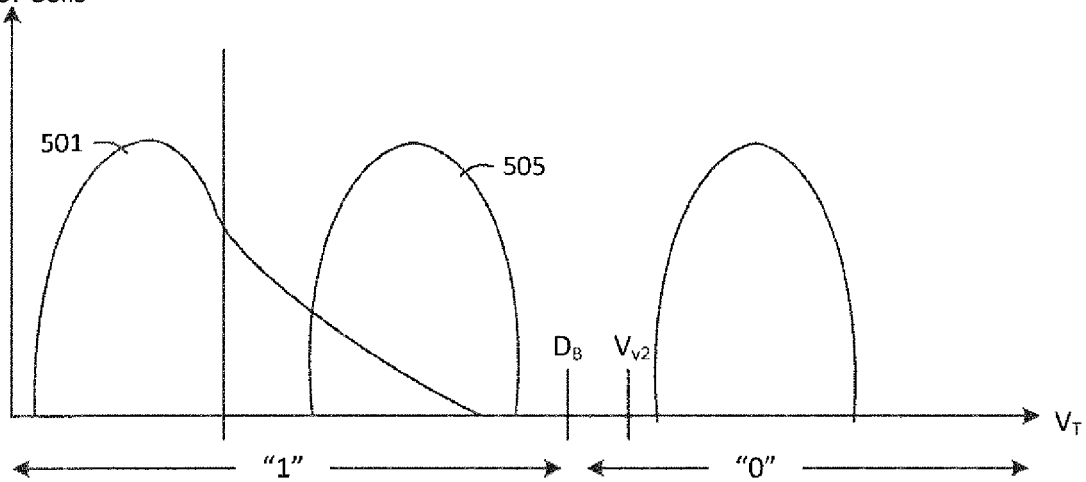
FIG. 5 shows distributions of memory cells after second stage programming.

Another difference between MLC memory and the memory recycling of FIGS. 4A-B is illustrated in FIG. 5. In general, in MLC memory, threshold voltage distributions must be distinguishable in order to read the bits represented by those distributions. Thus, in a three-state MLC memory, it would be necessary to maintain a sufficient margin between states, and reduce coupling and disturbance sufficiently, so that the three states remain distinct throughout programming of all states. In contrast, as shown in FIG. 5, distributions of memory cells programmed in the first round of programming may become substantially merged during the second round of programming. The erased state distribution 501 may extend into the programmed state distribution 505 after further programming. Because the data stored in the first round is destroyed (further programmed cells cannot be identified as previously programmed or erased) distinguishing between these two distributions is not required. All cells below $D_B$ are read as storing binary logic bit "1" as shown. Thus, a programming scheme may be used that causes disturbance to memory cells in the erased state 501, and relatively small margins may be used between distributions 501 and 505. This may allow faster programming and/or lower errors than in MLC programming.

It will be understood that because the further programming described above is destructive of any previously stored data, it is generally only performed when previously stored data is obsolete, i.e. when a block erase would normally have been performed. For example, when a host sends updated data that makes all data in a block obsolete, or when garbage collection copies valid data to a new location thus making all data in a block obsolete the block may be full of obsolete data.

FIG. 6 shows a scheme for dealing with a block that is full of obsolete data 615. A determination is made 617 as to whether the block contains only first round programmed data (i.e. whether second round programming has already been performed on the block). Flags may be provided to indicate whether blocks are erased, programmed with first round data only, or programmed with second round data. Flags may be maintained on-chip (i.e. the same chip where the memory array is located) or may be maintained in a memory controller or other chip. If the block contains only first round data then it can be recycled without an erase operation. The block parameters may be modified 619. For example, the assignments of binary logic states to threshold voltages may be modified from a first scheme (as shown in FIG. 4A) to a second scheme (as shown in FIG. 4B) with program and read parameters modified accordingly. The modified parameters may be signified by a flag or otherwise. The recycled block may then be released for second round programming 621 (e.g. returned to an erased block pool where it is treated as if it were erased). If the block is programmed beyond the first round (i.e. it has already been recycled) then it is erased 623. This may be performed in a conventional manner so that all cells are returned to the erased condition.

FIG. 7 shows a scheme for programming blocks 728. A determination is made 727 as to whether the block is a recycled block or an erased block (e.g. by checking a flag or other recording of the block's condition). If the block is recycled then a modified set of programming parameters is used 729 (e.g. the read verify voltage is higher and the number and/or amplitude of programming pulses may be greater than conventional programming parameters). If the block is not recycled (i.e. it is erased) then default programming parameters may be used 731.

FIG. 8 shows a scheme for reading data from a block 833. A determination is made as to whether the block is a recycled block 835. If it is recycled then a modified set of read parameters is used 837 (e.g. discrimination voltage is higher than default). If it is not a recycled block (i.e. has only undergone first round programming, not second round) then default parameters may be used 839.

Figure 9:
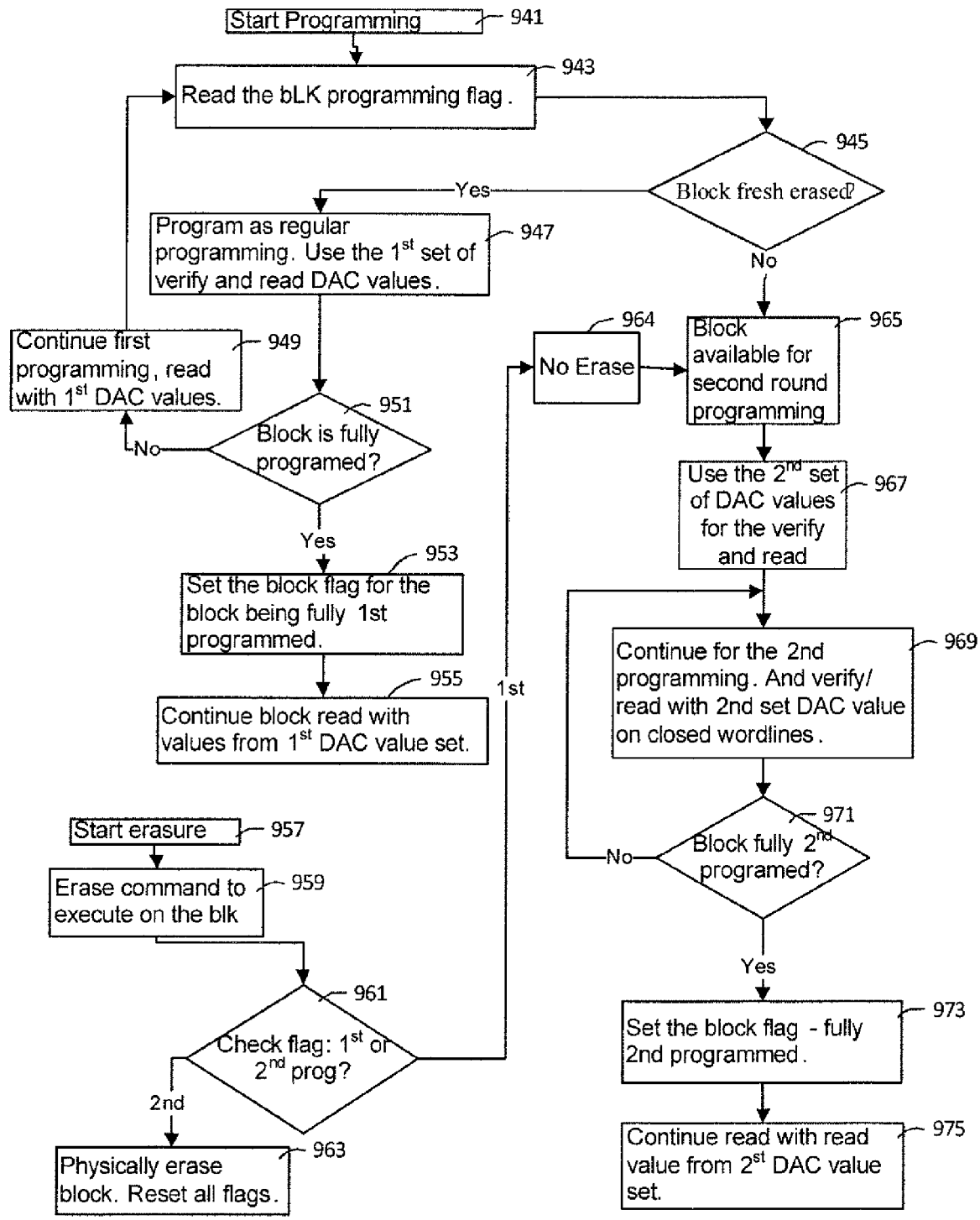
FIG. 9 illustrates overall operation of a memory system.

FIG. 9 shows overall operation of a memory system. When programming is initiated 941, a block programming flag is read 943 and a determination is made as to whether the block is freshly erased or whether it has undergone first round programming 945. If the block is freshly erased then programming may use default programming parameters 947, including program verify values. Programming may continue 949 until the block is fully programmed 951. Then a flag is set indicating the full condition 953. When reading data in the block the default reading parameters may be used 955.

When the block is selected for erase 957 (e.g. when it is found to be full, or substantially full, of obsolete data) a block erase command may be sent 959. A flag is checked 961 to determine whether the block was only subject to first round programming, or to second round programming. If the block is full of obsolete data after second round programming then it cannot be recycled and is physically erased 963. If it is first round programmed only, then no erase is performed and the execution of the erase command is canceled 964 and it is made available for further programming 965. Parameters are modified for the second round programming 967 (e.g. programming parameters and program verify parameters). Then programming continues 969 until the block is fully programmed by the second round programming 971. A flag is then set 973 to indicate this condition and the modified read parameters are used to read data in the block in this condition 975.

Although the examples above generally refer to memory cells that uses charge stored in a charge storage element (e.g. floating gate) to affect a transistor threshold voltage and thus reflect a programmed logic state, other memories use other physical phenomena to reflect programmed logic states and such cells may be similarly recycled without erasing by modifying an assignment scheme that assigns logic states to ranges of some readable variable and performing additional programming.

Conclusion

Although the various aspects of the present invention have been described with respect to exemplary embodiments thereof, it will be understood that the present invention is entitled to protection within the full scope of the appended claims. Furthermore, although the present invention teaches the method for implementation with respect to particular prior art structures, it will be understood that the present invention is entitled to protection when implemented in memory arrays with architectures than those described.

It is claimed:

1. A method of operating a Single Level Cell (SLC) flash memory comprising:
    assigning binary logical states to flash memory cell threshold voltage ranges in a block according to a first assignment scheme;
    programming memory cells of the block according to the first assignment scheme;
    subsequently, in response to determining that data programmed in the memory cells of the block is obsolete, assigning binary logical states to flash memory cell threshold voltage ranges in the block according to a second assignment scheme that is different to the first assignment scheme; and
    further programming the memory cells of the block according to the second assignment scheme without erasing the memory cells of the block between the programming and the further programming.

2. The method of claim 1 wherein the first assignment scheme assigns a first binary logical state to an erased threshold voltage range and assigns a second binary logical state to a programmed threshold voltage range.

3. The method of claim 2 wherein the second assignment scheme assigns the first binary logical state to the erased threshold voltage range and the programmed threshold voltage range, and assigns the second binary logical state to a further programmed threshold voltage range that is higher than the programmed threshold voltage range.

4. The method of claim 3 further comprising reading memory cells of the block using a first discrimination voltage when the memory cells are programmed and are not further programmed, and reading the memory cells of the block using a second discrimination voltage that is higher than the first discrimination voltage when the memory cells are further programmed.

5. The method of claim 1 further comprising, subsequently, in response to determining that further programmed data is obsolete, performing an erase operation.

6. A method of operating a Single Level Cell (SLC) flash memory array, comprising:
    programming a plurality of memory cells to either a first threshold voltage range representing a first binary logic state or a second threshold voltage range representing a second binary logic state according to a first assignment scheme; and
    subsequently, in a further programming operation that is performed without an intervening erase operation between the programming and the further programming, further programming individual memory cells of the plurality of memory cells to a third threshold voltage range representing the second binary logic state according to a second assignment scheme.

7. The method of claim 6 wherein the first and second threshold voltage ranges represent the first binary logic state in the second assignment scheme.

8. The method of claim 6 wherein the first and second threshold voltage ranges are non-overlapping and wherein memory cells programmed to the first and second threshold voltage ranges that are not further programmed to the third threshold voltage range have distributions that are allowed to be overlapping after the further programming.

9. The method of claim 6 wherein subsequent further programming is performed in response to identifying data from the first programming stored in the plurality of cells as obsolete.

10. The method of claim 6 wherein the first threshold voltage range is a negative threshold voltage range corresponding to an erased condition.

11. The method of claim 6 further comprising reading the plurality of memory cells using a first discrimination voltage after programming and prior to further programming, and reading the plurality of memory cells using a second discrimination voltage after the further programming.

12. The method of claim 6 further comprising, in response to determining that further programmed data is obsolete, performing an erase operation to return the plurality of memory cells to the first threshold voltage range.

13. A non-volatile memory system comprising:
    an array of nonvolatile memory cells configured to store one bit per memory cell; and
    programming circuits that are configured to program memory cells, in a first programming operation, to either a first threshold voltage range representing a first binary logic state or a second threshold voltage range representing a second binary logic state according to a first assignment scheme, and subsequently, in a second programming operation performed without an intervening erase operation between the first and second programming operations, to program some of the programmed memory cells to a third threshold voltage range that represents the second binary logic state according to a second assignment scheme, the first and second threshold voltage ranges representing the first binary logic state in the second assignment scheme.

14. The non-volatile memory system of claim 13 further comprising reading circuits that are configured to read memory cells programmed by only the first programming operation using a first discrimination voltage, and read memory cells programmed by the second programming operation using a second discrimination voltage.

15. The non-volatile memory system of claim 13 further comprising erase circuits that are configured to erase memory cells after data programmed in the second program operation is obsolete.

16. The non-volatile memory system of claim 13 further comprising status circuits that indicate the status of a plurality of memory cells as either: (a) erased, (b) programmed by the first programming operation only, or (c) programmed by the second program operation.

17. The non-volatile memory system of claim 16 wherein the status circuits are located on a memory controller integrated circuit chip that is separate from a memory integrated circuit chip where the array of nonvolatile memory cells is located.

18. The non-volatile memory system of claim 13 wherein the array of non-volatile memory cells is a 2-dimensional NAND or NOR flash memory array.

19. The non-volatile memory system of claim 13 wherein the array of non-volatile memory cells is a 3-dimensional memory array that has stacks of memory cells extending in a direction perpendicular to a surface of a substrate.

20. The non-volatile memory system of claim 13 wherein the array of non-volatile memory cells uses electrical charge, either negative charge from electrons or positive charge from holes, as an indicator of a programmed state.

21. The non-volatile memory system of claim 13 wherein the array of non-volatile memory cells uses magnetization as an indicator of a programmed state.

* * * * *